(12) United States Patent
Rissman et al.

(10) Patent No.: US 6,566,262 B1
(45) Date of Patent: May 20, 2003

(54) METHOD FOR CREATING SELF-ALIGNED ALLOY CAPPING LAYERS FOR COPPER INTERCONNECT STRUCTURES

(75) Inventors: Paul Rissman, Palo Alto, CA (US); Richard Schinella, Saratoga, CA (US); Sheldon Aronowitz, San Jose, CA (US); Vladimir Zubkov, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/004,461

(22) Filed: Nov. 1, 2001

(51) Int. Cl.$^7$ ............................................. H01L 21/44
(52) U.S. Cl. ...................... 438/687; 438/627; 438/643; 438/653; 438/658
(58) Field of Search .............................. 438/687, 627, 438/643, 653, 658

(56) References Cited

U.S. PATENT DOCUMENTS

| | | | | |
|---|---|---|---|---|
| 6,100,195 A | * | 8/2000 | Chan et al. ................. | 438/687 |
| 6,147,000 A | * | 11/2000 | You et al. .................... | 438/687 |
| 6,228,759 B1 | * | 5/2001 | Wang et al. ................. | 438/687 |
| 2002/0013045 A1 | * | 1/2002 | Palmans et al. ............ | 438/687 |

* cited by examiner

*Primary Examiner*—John F. Niebling
*Assistant Examiner*—Lynne A Gurley
(74) *Attorney, Agent, or Firm*—Beyer Weaver & Thomas, LLP

(57) ABSTRACT

Embodiments of the invention include a capping layer of alloy material formed over a copper-containing layer, the alloy configured to prevent diffusion of copper through the capping layer. In another embodiment the alloy capping layer is self-aligned to the underlying conducting layer. Specific embodiments include capping layers formed of alloys of copper with materials including but not limited to calcium, strontium, barium, and other alkaline earth metals, as well as materials from other groups, for example, cadmium or selenium. The invention also includes methods for forming an alloy capping layer on a copper-containing conducting structure. One such method includes providing a substrate having formed thereon electrically conducting layer comprised of a copper-containing material and forming an alloy capping layer on the electrically conducting layer. In another method embodiment, forming the alloy capping layer includes forming a self-aligned capping layer over the conducting layer.

In another method embodiment for forming a capping layer on a copper-containing conducting structure, a substrate having formed thereon electrically conducting layer comprised of a copper-containing material is provided. A layer of reactive material is then formed on the surface of the substrate. This is followed by reacting a portion of the layer of reactive material with the copper-containing material of the conducting layer to form an alloy material on the conducting layer. Unalloyed reactive material is removed from the substrate by heating the substrate to a temperature where the unalloyed reactive material desorbs from the surface of the substrate but where the alloy material remains in place on the substrate surface thereby forming a self-aligned capping layer. In another embodiment, the process is repeated iteratively until a capping layer having the desired thickness is formed.

23 Claims, 6 Drawing Sheets

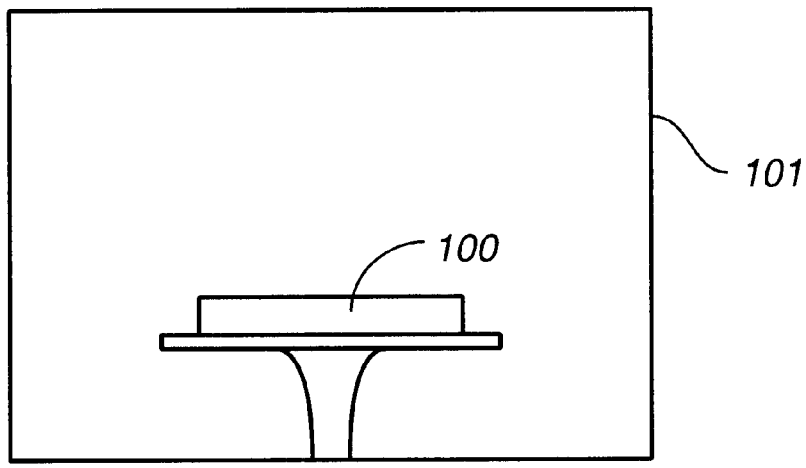
FIG._1
*(PRIOR ART)*
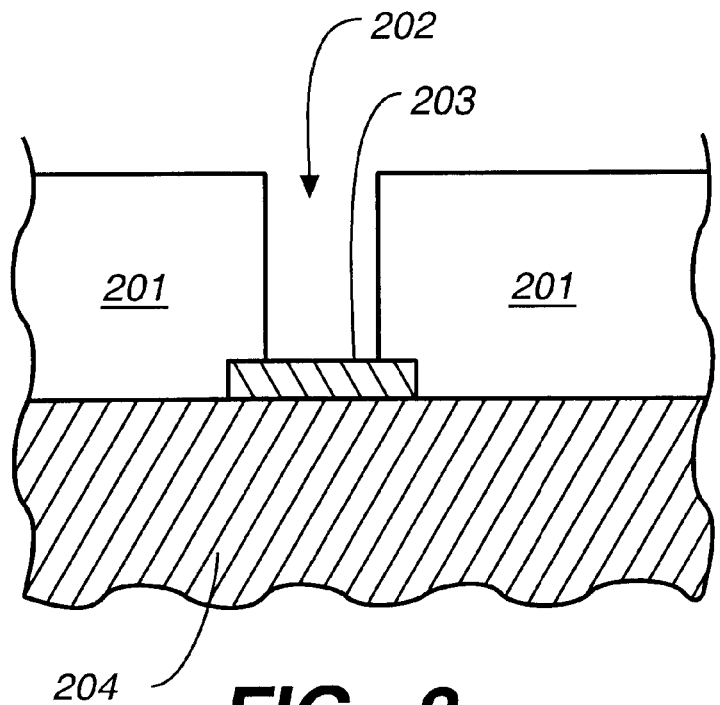
FIG._2
*(PRIOR ART)*

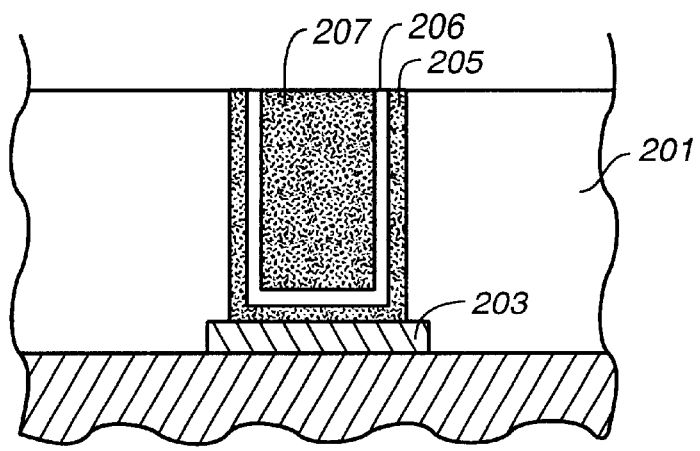
FIG._3
(PRIOR ART)
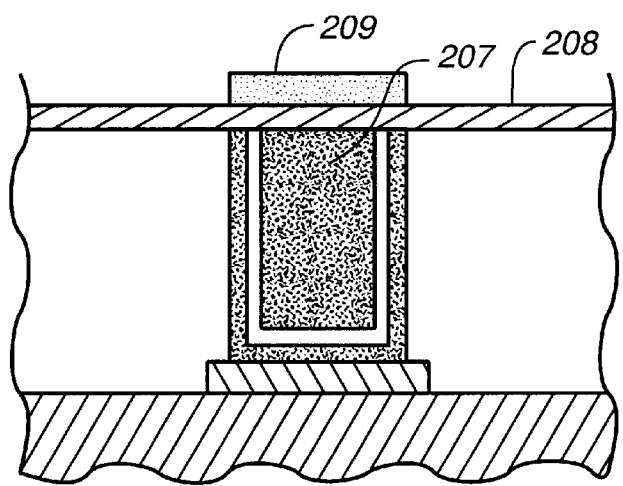
FIG._4
(PRIOR ART)
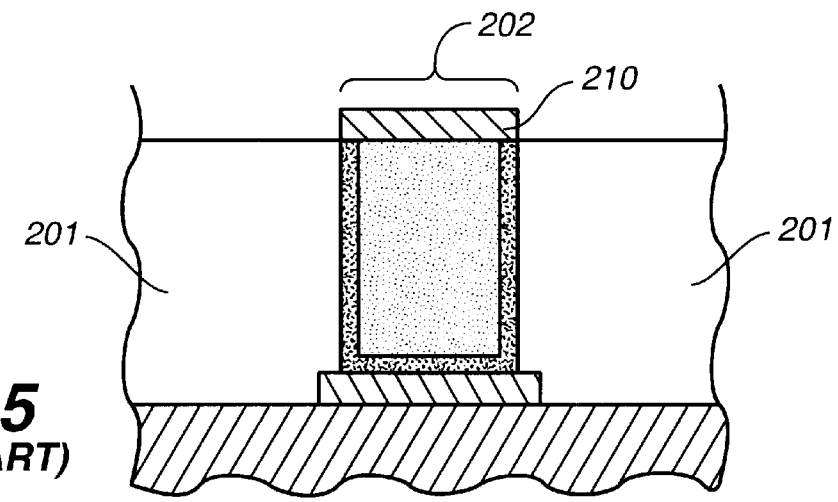
FIG._5
(PRIOR ART)

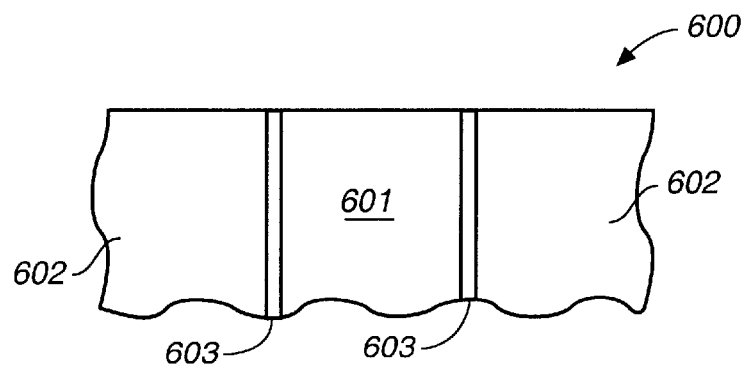
FIG._6A
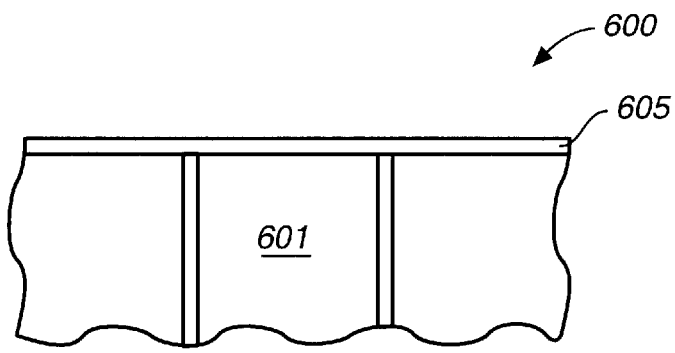
FIG._6B
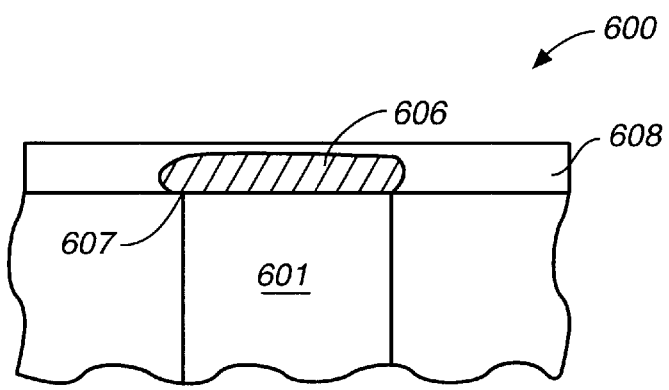
FIG._6C
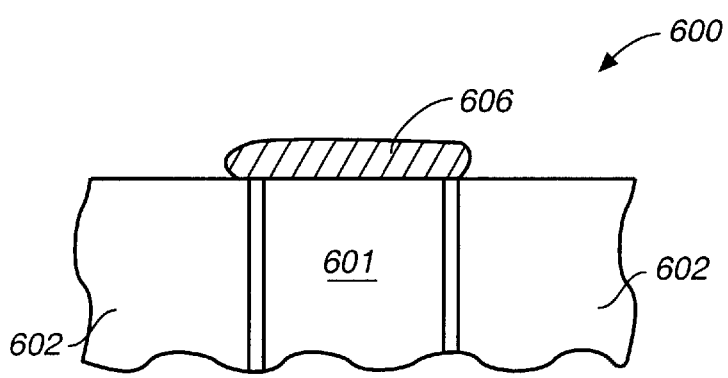
FIG._6D

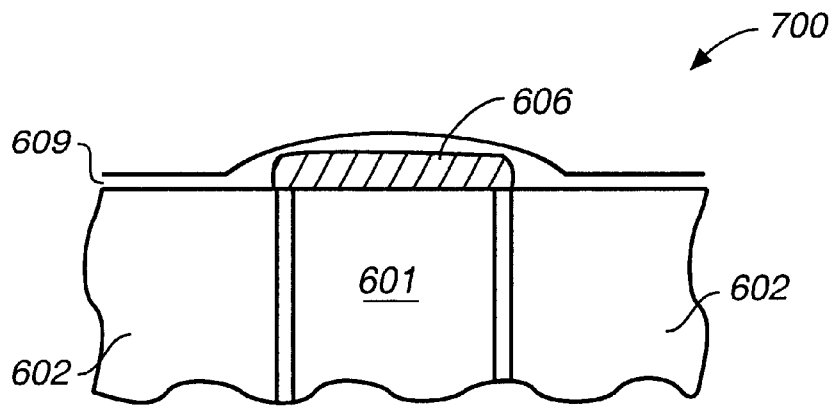
FIG._7A
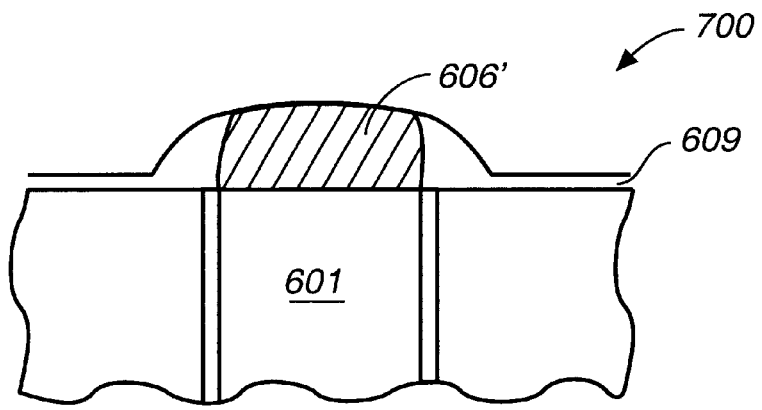
FIG._7B
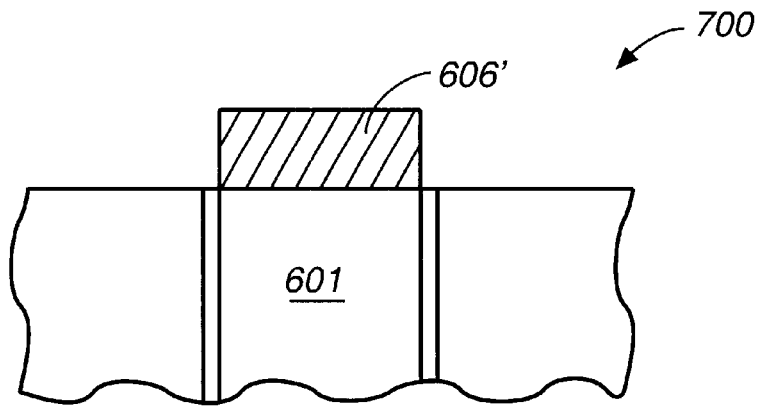
FIG._7C

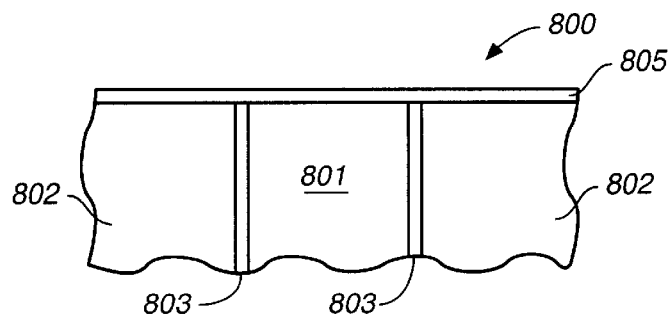
FIG._8A
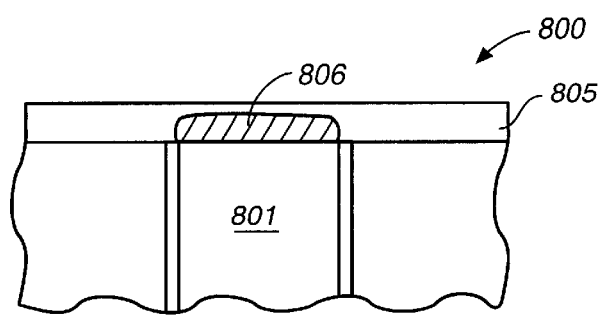
FIG._8B
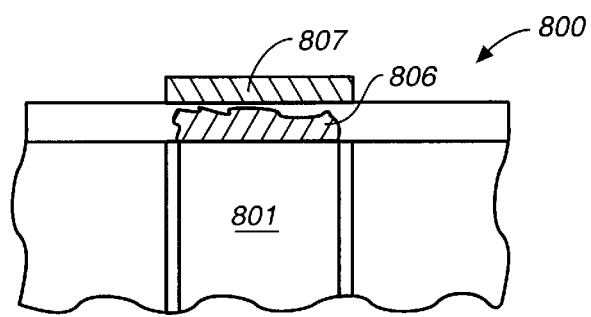
FIG._8C
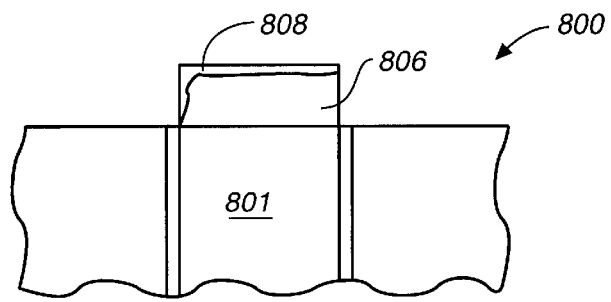
FIG._8D
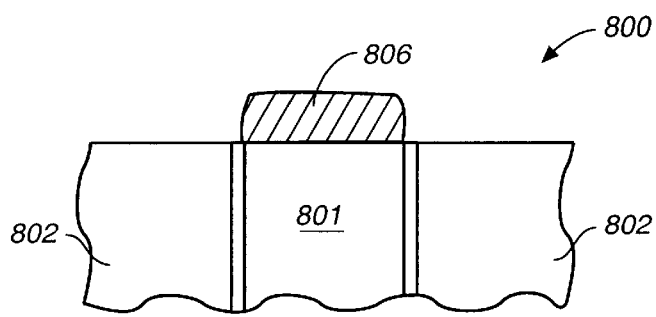
FIG._8E

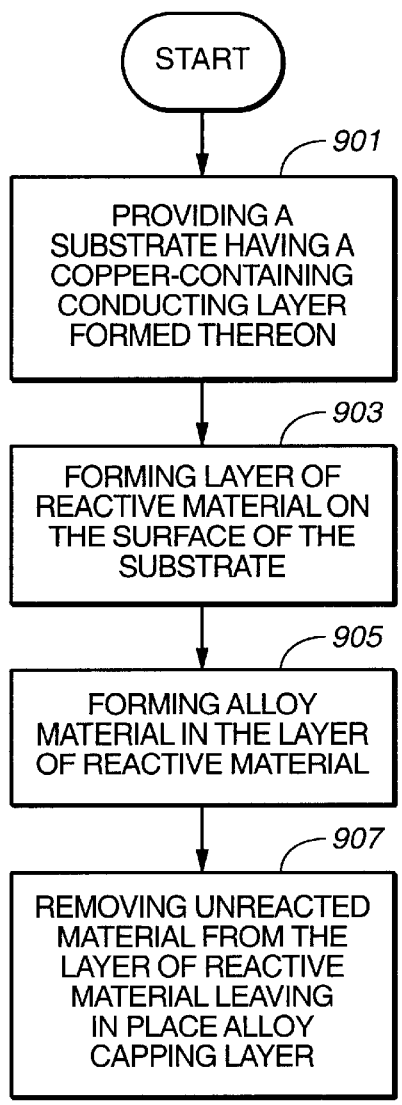
FIG._9
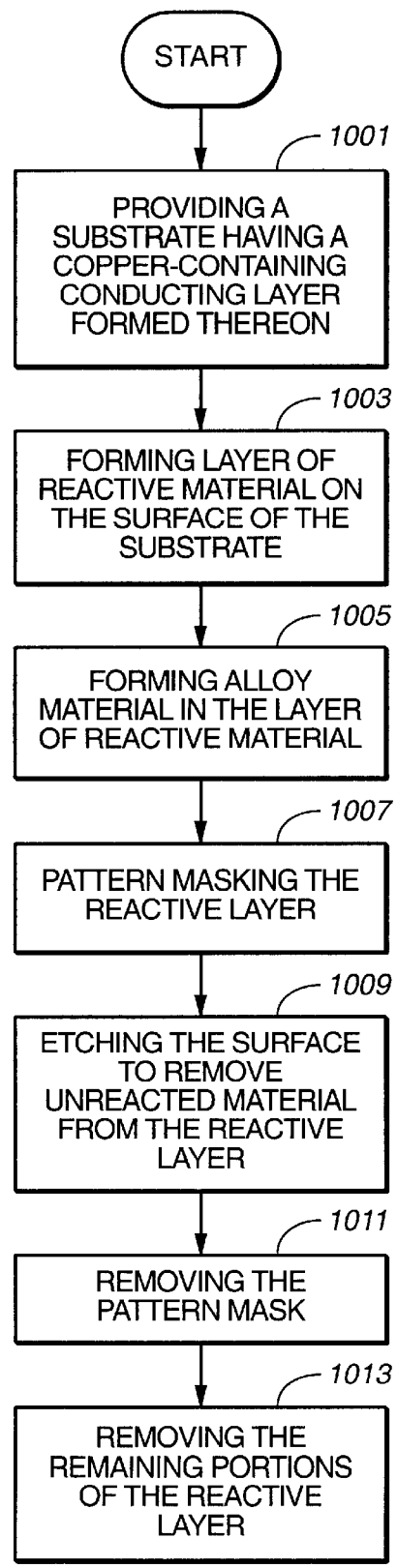
FIG._10

METHOD FOR CREATING SELF-ALIGNED ALLOY CAPPING LAYERS FOR COPPER INTERCONNECT STRUCTURES

TECHNICAL FIELD

The invention described herein relates generally to semiconductor devices and processing. In particular, the invention relates to capping layers used on copper conducting structures in semiconductor devices and related fabrication methods. More particularly, the invention relates to methods and structures for creating self-aligned alloy capping layers on copper conducting structures.

BACKGROUND

The semiconductor industry has moved to using copper in various aspects of semiconductor devices due to certain advantages of copper over other metals. Copper has lower resistivity than, for example, aluminum. As a result, copper circuitry suffers less from resistance-capacitance (RC) delays. This makes copper systems faster. Further, copper has increased resistance to electromigration, thereby enabling smaller scaling of semiconductor devices. However, with increased use, certain problems particular to copper have become more prevalent. One such problem is that copper materials have high diffusivity through dielectric and silicon materials in which the copper is deposited. This is problematic because the presence of copper in these materials may "poison" the materials and lead to semiconductor device failure.

In conventional methodologies, a barrier material is typically deposited on the dielectric material between the copper layer and the dielectric (or silicon) material, thereby preventing the copper from diffusing into the dielectric or silicon material. Typically, tantalum (Ta) or titanium (Ti) based barrier materials (e.g., tantalum nitrides (TaN), tantalum silicon nitrides (TaSiN), or titanium nitrides (TiN)) are used as barrier layers for copper. Additionally, copper layers are covered in a capping layer that also serves as a barrier to copper diffusivity. Thus, copper layers are completely encased in barrier materials. Conventional capping layers are formed of barrier materials, for example, silicon nitride (such as $Si_3N_4$) materials. However, such materials also have limitations. One disadvantage of $Si_3N_4$ materials is the capacitance problems such materials create. Also, such materials can have porous boundaries which create unwanted copper diffusion paths. Additionally, the thickness of existing barrier layers create some difficulties as feature size decreases. This is especially true as feature sizes decrease below 0.18 micron $\mu$.

A conventional prior art process for creating a copper conducting structure is described hereinbelow with respect to FIGS. 1–5. In FIG. 1, a typical semiconductor wafer 100 is placed in a process chamber 101 and various layers of material and circuit structures are formed thereon.

FIG. 2 is a cross-section view of a portion of semiconductor substrate. The depicted substrate includes a dielectric layer 201 having an opening therein 202. In the depicted illustration the opening 202 defines a via structure having a conducting plug 203 at its bottom. The conducting plug 203 connects to an underlying conducting layer 204. The conducting layer 204 can be electrically connected to an active device or underlying metal or interconnect layers formed on the wafer (or substrate). Such openings can define a wide range of features or devices, including but not limited to vias, trenches, or inter-level interconnect structures. Such structures can be fabricated using conventional techniques known to one skilled in the art. The dielectric layer 201 can be formed of many dielectric materials including silicon dioxide; however, combinations of silicon dioxide and other doped dielectrics (e.g. BPSG, PSG) are also commonly used. In addition, low-K dielectric materials can be used. This opening in the dielectric layer 201 can be filled to with conducting materials to form conducting structures.

FIG. 3 shows the topmost portion of FIG. 2. An insulating layer 201 is formed over the substrate surface, including plug 203. Openings are formed in the insulating layer. For example, the region over the connector 203 is etched away to define a trench 202. Then, a barrier layer 205 is formed over the surface, including the opening 202. Such a barrier layer 205 is typically formed of tantalum (Ta) containing materials, although other barrier materials can be used. After forming the barrier layer 205, a copper seed layer 206 is formed over the barrier layer 205. The seed layer 206 provides a conductive surface for the subsequent deposition of a bulk copper layer 207 (which fills in the trench 202 and covers the rest of the surface). Such bulk copper layers 207 are often formed using electroplating, but other deposition techniques are also possible. The bulk copper layer 207 is then planarized, for example, using chemical mechanical polishing (CMP).

FIGS. 4 and 5 illustrate the formation of a conventional capping layer. Referring to FIG. 4, a layer of barrier material 208 is formed over the surface of the substrate. Commonly, such layers are formed to a thickness on the order of 500 Å. Subsequently, the layer of barrier material 208 is patterned and masked with photoresist 209. Holes can be etched in regions of barrier material 208 to make connections to underlying conducting layers. As shown in FIG. 5, the surface is etched so that a capping layer 210 of barrier material is formed over the opening 202 in the dielectric layer 201. Subsequently, the photoresist layer is removed, leaving the capping layer 210 in place.

Although suitable for their intended purposes, conventional capping layers are relatively thick, require additional alignment and masking steps, and require additional etching to create the final structure. Improvements in such capping layers can be made. The principles of the present invention are directed toward improved capping layers and improved methodologies for constructing capping layers.

SUMMARY OF THE INVENTION

In accordance with the principles of the present invention, the invention includes structure and method for forming alloy capping layers over conducting layers in semiconductor structures. One embodiment comprises a structure including a capping layer of alloy material formed over a copper-containing conducting layer, the alloy configured to prevent diffusion of copper through the capping layer. Such an embodiment can include self-aligned capping layers. Specific embodiments include capping layers formed of copper alloys. In particular, copper alloys that include alkaline earth metals including, but not limited to calcium, strontium, barium, and elements from other groups, including but not limited to cadmium or selenium.

One method embodiment includes providing a substrate having formed thereon electrically conducting layer comprised of a copper-containing material and forming an alloy capping layer on the conducting layer. In another method embodiment, forming the alloy capping layer includes forming a self-aligned capping layer over the conducting layer.

In another embodiment, a substrate having formed thereon electrically conducting layer comprised of a copper-containing material is provided. A layer of reactive material is then formed on the surface of the substrate. A portion of the layer of reactive material reacts with the copper-containing material of the conducting layer to form an alloy material that is resistant to copper diffusion, the alloy material being formed on the conducting layer. Unalloyed reactive material is removed from the substrate by heating the substrate to a temperature where the unalloyed reactive material desorbs from the surface of the substrate but where the alloy material remains in place on the substrate surface. The resulting structure is a self-aligned capping layer. In another embodiment, the process is repeated iteratively until a capping layer having the desired thickness is formed.

In another method embodiment, a non-self-aligned capping layer is formed on a copper-containing conducting layer. The method includes the operations of forming a layer of reactive material on the surface of the substrate and reacting a portion of the layer of reactive material with the copper-containing material of the conducting layer to form an alloy material on the conducting layer. The layer of reactive material is pattern masked to create a pattern wherein a mask material masks the reactive material over the conducting layer. The layer of reactive material not covered by the mask is etched away and the mask material is then removed. Remaining unreacted material in the remaining reactive layer is removed from the substrate leaving alloy material in place to form the capping layer. In one embodiment, this remaining unreacted material can be removed by heating the substrate to a temperature where the remaining unreacted material desorbs from the surface of the substrate but where the alloy material remains in place on the substrate surface thereby forming the capping layer.

These and other aspects of the invention will be disclosed in greater detail in the following detailed description.

BRIEF DESCRIPTION OF THE DRAWINGS

The following detailed description will be more readily understood in conjunction with the accompanying drawings, in which:

FIGS. 1–5 describe a process for forming a conventional copper capping barrier layer.

FIG. 1 is a simplified figurative depiction of a semiconductor wafer in a process chamber.

FIG. 2 is a cross-sectional view of a semiconductor surface formed on the wafer of FIG. 1.

FIGS. 3–5 are cross-section views of a semiconductor surface depicting the topmost portion of FIG. 2 having a conventional capping layer being formed on the underlying copper layer.

FIGS. 6(a)–6(d) are cross-sectional views of a semiconductor surface showing the topmost portion of semiconductor wafer, showing aspects of one exemplary process for forming a self-aligned alloy capping layer for use with copper-containing conducting layers in damascene and dual damascene processes.

FIGS. 7(a)–7(c) are cross-sectional views of a semiconductor surface showing the topmost portion of semiconductor wafer, showing aspects of another exemplary process for iteratively forming self-aligned alloy films that comprise alloy capping layers for use with copper-containing conducting layers in damascene and dual damascene processes.

FIGS. 8(a)–8(e) are cross-sectional views of a semiconductor surface showing the topmost portion of semiconductor wafer, showing aspects of another process for forming an alloy capping layer for use with conducting layers in damascene and dual damascene processes.

FIG. 9 is a flow diagram describing a suitable method embodiment for implementing a process for forming a self-aligned alloy capping layer for use with conducting layers in damascene and dual damascene processes in accordance with the principles of the present invention.

FIG. 10 is a flowchart describing another method embodiment for forming an alloy capping layer for use with conducting layers in damascene and dual damascene processes in accordance with the principles of the present invention.

It is to be understood that in the drawings like reference numerals designate like structural elements. Also, it is understood that the depictions in the drawings are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various method embodiments for forming capping layers for conducting structures will be disclosed. In particular, embodiments concerning copper alloy capping layers will be described. Also, the formation of self-aligned capping layers over copper-containing conducting structures will be detailed.

One embodiment in accordance with the principles of the present invention is directed to a method of forming a self-aligned copper alloy capping layer. As used herein, a self-aligned capping layer shall be defined as capping layer that is appropriately positioned with respect to a corresponding conducting layer without the need for separate alignment and masking steps to position the capping layers above their corresponding conducting layer.

The depicted embodiments create capping layers by treating a prepared substrate in an appropriate processing chamber. Such prepared substrates commonly have an insulating layer formed thereon. The insulating layers have and openings formed therein in which an inlaid conducting layer will be formed. In typical embodiments, inlaid conducting layers are formed of copper or copper-containing material. Where copper-containing conducting layers are used, it is common to use at least one copper barrier layer to prevent copper diffusion into surrounding materials. Subsequent to the formation of barrier layers, a copper seed layer is formed over the surface. A layer of bulk copper is then formed on the copper seed layer. The substrate surface is then planarized to create a planar surface having an insulating layer having an inlaid conducting layer formed therein. In accordance with the principles of the present invention the conducting layer is treated with certain materials to form a capping layer over the conducting layer. Such capping layers serve to prevent copper materials from leaving the conducting layer and poisoning surrounding materials.

It is the formation and structure of these capping layers that are the subject of this patent. The following discussion describes the formation of semiconductor structures that include conducting layers having capping layers formed thereon. In particular, is the formation of self-aligned capping layers on inlaid copper-containing conducting layers formed in insulating layers. The principles of the present invention have wide application to any current conducting layers that include copper containing materials, especially those used in damascene and dual damascene processes. As should be readily appreciated by those having ordinary skill in the art, the principles of the present invention can be readily applied to any conductive structures used in semiconductor fabrication, including but not limited to: vias, interconnects, trenches, trenches overlying vias, contacts, interconnects through inter-level dielectrics (ILD's) and the like.

FIGS. 6(a)–6(d) depict an embodiment for forming an alloy capping layer over an inlaid conducting layer formed in an opening (recess) in an insulating layer. Such processes are compatible with so-called single damascene and dual damascene processes. FIGS. 6(a)–6(d) depict a cross-section view of a portion of semiconductor surface. The structures depicted are similar to those shown in FIG. 3, which shows the topmost portion of FIG. 2.

FIG. 6(a) shows a portion of a substrate 600 in readiness for processing in accordance with an embodiment of the present invention. FIG. 6(a) depicts a cross section view of a portion of a substrate 600 surface showing an insulating layer 602 having an opening therein. The opening includes a barrier layer 603. The opening is also filled with a conducting material to form inlaid conducting structure 601. Typically, the inlaid conducting structure 601 is formed of copper or a copper-containing material. Although not required to practice the invention, the inlaid conducting structure 601 ordinarily includes a barrier layer 603 formed between the inlaid conducting structure 601 and the insulating layer 602. Such structures can be formed by conventional processes known to those having ordinary skill in the art. In particular, the methods and materials for forming barrier layers 603 are well known to those having ordinary skill in the art. A barrier layer 603 can be constructed using a variety of barrier materials known to those having ordinary skill in the art. Commonly used materials include but are not limited to TiN, Ta, or Ta-containing materials. Alternatively, other barrier materials known to persons having ordinary skill in the art may be used to form barrier layer 603. Also, barrier layers 603 can comprise more than one layer of barrier material.

Insulating layers 602 can comprise ordinary dielectric materials like silicon dioxide. However, combinations of silicon dioxide and other doped dielectrics (e.g., BPSG, PSG) are also commonly used. Additionally, low-K dielectric materials or other electrically isolating materials are also used. Examples include spin-on and CVD polymeric materials based on silicon or carbon, or based on combinations of silicon and carbon. Particular low-K materials include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-K materials include polymers of parylene and napthalene, copolymers of parylene with polysiloxanes or teflon, and polymers of polysiloxane. Once the conducting material and barrier layers are formed, the surface is planarized to remove excess conducting material (e.g., copper) and to provide a surface for forming capping layers.

The alloy capping layer can now be formed. Referring to FIG. 6(b), one embodiment for constructing an alloy capping layer begins with the formation of a first layer of reactive material 605 on the substrate 600 surface. Such reactive materials 605 are chosen for their ability to react with the copper or copper oxides to form complexes which are resistant to copper diffusion. These complexes are copper alloys. The reactive materials 605 react with the copper or copper oxides present in the copper-containing conducting layer 601 to form copper complexes (alloys). One suitable reactive material used in the first layer of reactive material 605 is calcium (Ca). Other suitable materials include, but are not limited to strontium (Sr) or barium (Ba). Also, suitable are selenium (Se) and cadmium (Cd).

In the depicted embodiment, the first layer of reactive material 605 is formed using calcium. A calcium layer 605 can be formed on the substrate surface by a number of processes. In one suitable process for Ca deposition, a substrate (for example, the wafer 100 of FIG. 1) is placed in a process chamber (like an atomic layer deposition ALD reaction chamber) and the substrate is maintained at a relatively low temperature. In one embodiment the temperature is about ranges from about 0° C. to about 100° C., with a preferred temperature of about 25° C. A calcium source is heated to generate gaseous calcium. The calcium source can be heated to a wide range of temperature to deposit calcium onto the substrate. When the calcium source is heated to a temperature in the range of about 590° C. to about 600° C. gaseous calcium is generated having vapor pressure in the range of about 7 mTorr. By raising the calcium source to an even higher temperature, faster rates of calcium deposition can be achieved. For example, if the calcium source is heated to a temperature in the range of about, 680° C. to about 690° C., gaseous calcium is generated having vapor pressure an order of magnitude higher than the lower temperature example. The calcium source can be heated in the process chamber, or alternatively outside of the process chamber with gaseous calcium being flowed into the chamber using a carrier gas. Thus, again referring to FIG. 6(b), the cooler temperature of the substrate 600 provides the heated calcium atoms a ready location to condense and form a calcium layer 605. Thus, calcium can be deposited onto the surface of the substrate 600. The calcium can be deposited to a variety of thicknesses, preferably from about 5 Å (angstrom) to about 500 Å. In one embodiment the calcium layer 605 is formed to a thickness of about 500 Å. In another embodiment, thinner layers can be used. For example, in one embodiment a 50 Å layer can be used. A layer 605 in the range of about 50 Å to about 200 Å is advantageous because it is thinner than most capping layers currently in use. Additionally, rather than being formed in a single operation, capping layers of the present invention can be formed in a series of steps. For example, several thin calcium films, deposited 10 Å at a time, can be formed over each other.

Referring to FIG. 6(c), after the formation of a first layer of reactive material 605 (here, calcium), copper from the conducting layer 601 begins to diffuse into the calcium layer 605. Beginning at the interface 607 between the conducting layer 601 and the calcium layer 605, calcium and copper undergo reactions to form copper and calcium containing complexes. Such complexes form in an alloy region 606 having copper/calcium alloy materials. Advantageously, this alloy region 606 is localized on top of the conducting layer 601. Additionally, outside the alloy region 606 the deposited calcium (or other reactive material) remains largely unaffected (unreacted) forming a layer 608 of unreacted material (in this case calcium). After each deposition cycle, the substrate temperature can be raised to a temperature in the range of about 200° C. to about 400° C. This facilitates the formation of copper/calcium alloy materials. The substrate is maintained at this temperature for about one to five minutes. The entire process is conducted under vacuum conditions.

In continuation, once the first layer of reactive material 605 (here, calcium) is formed to a desired thickness (e.g., 10 Å), and the copper and calcium containing complexes (alloys) 606 have formed, the substrate 600 is heated to an elevated temperature. The temperature must be hot enough to cause the unreacted material 608 to desorb into the process chamber atmosphere. Also, the temperature must be chosen such that the complexes (alloys) 606 remain in place on the substrate 600 above the conducting layer 601. In the case of calcium one preferred substrate temperature is in the range of about 590° C. to about 600° C. FIG. 6(d) depicts an embodiment where the complexes (alloys) 606 remain in place on the conducting layer 601, but the unreacted materials (608 of FIG. 6(c)) have been substantially desorbed off the insulating layer 602 into the process atmosphere. In one embodiment, the process chamber atmosphere can be continuously recycled removing the desorbed unreacted materials (here, calcium) from the process environment preventing unwanted redeposition onto the substrate 600.

In a case where the first layer of reactive material 605 is thick (on the order of a few hundred Å) this simple process completes the formation of a capping layer 606. However, in one preferred embodiment a series of thin films can be used to form a thin capping layer having desirable properties.

Referring to FIG. 7(a), a substrate 700 having an inlaid layer 601 of copper-containing conducting material formed in an insulating layer 602 is depicted. The substrate 700 includes a film of copper/calcium alloy 606 formed on the inlaid conducting layer 601. This substrate 700 is cooled to a lower temperature in the range of about 0° C. to about 100° C., preferably about 25° C. Again, a reactive material is introduced into the process chamber at elevated temperature. In the depicted embodiment, a calcium source at a temperature of about 590° C. to about 600° C. is used to generate a calcium gas that is deposited on the surface in a second layer 609 of reactive material. As previously discussed, higher temperatures can be used to generate faster deposition rates.

The copper in the alloy layer 606 migrates into the second layer 609 of reactive material to form a larger alloy layer 606' of increased thickness. This is shown in FIG. 7(b). For example, a 20 Å alloy layer 606' is now formed. Again, the process chamber containing the substrate 700 is evacuated to remove the calcium atoms from the ambient process environment.

Once the calcium gas is removed from the process chamber, the substrate 700 is again heated to an elevated temperature to cause the unreacted material 609 to desorb into the process chamber atmosphere. FIG. 7(c) depicts an embodiment where the complexes (alloys) 606' remain in place but the unreacted materials have been substantially desorbed off the substrate 700 into the process atmosphere. Again, the process chamber atmosphere can be continuously recycled removing the desorbed unreacted materials (here, calcium) from the process environment preventing unwanted redeposition onto the substrate 700. This process can be repeated in numerous iterations to generate an alloy layer 606' having a very precise thicknesses. Alloy layers (e.g., 606) formed as described herein, being resistant to copper diffusion, form excellent capping layers. Additionally, because such the alloy layers 606 form only in the regions over the conducting layer 601 the capping layer is said to be self-aligning.

In another similar embodiment a cadmium deposition source can be used. In a process similar to that described hereinabove, cadmium films are formed instead of the described calcium films. Cadmium also forms complexes with the copper and copper oxides of the copper-containing conducting layer in much the same way that calcium formed complexes with copper-containing materials. These copper and cadmium complexes form alloys that are excellent barriers to copper diffusion. Thus, such copper/cadmium alloys can also be used to form self-aligned capping layers. One advantageous feature of using cadmium is that a cadmium source only needs be heated to about 260° C. in order to provide a good source of cadmium gas for cadmium deposition. This is in contrast to, for example, the calcium source temperature of about 590° C. used to deposit calcium layers. Copper/cadmium alloys can be formed more effectively by imposing an external electric field. Such a field facilitates the migration of copper into the cadmium layer where copper/cadmium alloys can be formed. The imposition of the electric field aids in the creation of copper/cadmium alloys that will not desorb when the substrate temperature is raised to desorb the unreacted cadmium from the substrate. A preferred temperature range for desorbing the unreacted cadmium into the ambient while permitting the copper/cadmium alloys to remain on the substrate is in the range of about 250° C. to about 260° C. As previously mentioned, other suitable reactive materials include, but are not limited to strontium, barium, or other alkaline earth metals. Also, selenium provides a suitable reactive material.

The inventors contemplate yet another approach for creating a capping layer. Referring to FIG. 8(a), a substrate 800 is provided having an electrically conductive layer 801 inlaid in an insulating layer 802. The electrically conductive layer 801 comprises copper-containing materials. In most embodiments, the interface between the insulating layer 802 and the electrically conductive layer 801 includes at least one barrier layer 803. Over the substrate 800 is formed a layer of reactive material 805. As described herein, the reactive materials 805 react with the copper or copper oxides present in the copper-containing conducting layer 801 to form copper complexes (alloys). In one embodiment, the reactive material 805 is Ca. Other suitable materials include, but are not limited to Sr, Ba, or other alkaline earth metals. Also, suitable are cadmium and selenium.

In the depicted embodiment, the layer of reactive material 805 is formed using calcium. The calcium layer 805 can be formed on the substrate surface using any of the previously described processes. The calcium can be deposited to a variety of thicknesses, from about 5 Å to about 500 Å, preferably from about 100 Å to about 500 Å. In one embodiment the calcium layer 805 is formed to a thickness of about 500 Å.

As depicted in FIG. 8(b), after the formation of a first layer of reactive material 805 (here, calcium), copper from the conducting layer 801 begins to diffuse into the calcium layer 805. The rate of such diffusion increases at higher temperatures. Therefore, the substrate 800 is heated. Suitable temperatures being in the range of about 200° C. to about 400° C. The calcium and copper undergo reactions to form copper and calcium containing complexes. Such complexes form in alloys in the alloy region 806. The alloys comprise copper/calcium alloy materials. As discussed hereinabove, this alloy region 806 is localized on top of the conducting layer 801. Additionally, outside the alloy region 806 the deposited calcium (or other reactive material) remains largely unaffected (unreacted). Once the first layer of reactive material 805 is formed and the copper and calcium alloy has formed, the process chamber containing the substrate 600 is evacuated to remove the calcium atoms from the ambient process environment.

In a next process, the unreacted material 805 is removed. Many methods for achieving this are known to those having ordinary skill in the art. Desorption has already been discussed. Etching is also possible. One etching approach is depicted with respect to FIGS. 8(c) and 8(d). The substrate 800 is pattern masked 807 to protect the regions above the alloy 806 and conducting layer 801. Such masking can be achieved using photoresist or other masks. Subsequently, the substrate 800 surface is etched. In one embodiment, such etching can be accomplished using chlorine or fluorine-containing etchants (e.g., HF). Many other suitable etchants or etching techniques can also be used. FIG. 8(d) depicts the substrate surface 800 after etching and after removal of the mask. Above the conducting layer 801 lies the alloy region 806 and the remaining unreacted material (calcium) 808. Such an approach is particularly useful because it does not require molecular control over the rate of deposition.

With respect to FIG. 8(e), the substrate 800 is then heated to an elevated temperature. As with the previously discussed embodiments, the temperature must be hot enough to cause the unreacted material 808 to desorb into the process chamber atmosphere without desorbing the alloy 806. For calcium a preferred substrate temperature is in the range of about 590° C. to about 600° C. FIG. 8(e) depicts an embodiment where the alloy 806 remains in place and the unreacted materials have been substantially desorbed off the insulating layer 802 into the process atmosphere. The process chamber atmosphere can be continuously recycled removing the desorbed unreacted materials (here, calcium) from the process environment preventing unwanted redeposition onto the substrate 800. The forgoing method can be applied to alloy capping layers comprising other materials. In particular, copper alloys including strontium, barium, or other alkaline earth metals. And also, cadmium and selenium.

As with the other embodiments, the surface can then be subjected to further processing. For example, further process layers can be constructed over the described structures.

FIG. 9 shows a flow diagram that depicts a method embodiment in accordance with the principles of the present invention. The method embodiment of FIG. 9 can be used to construct self-aligned capping layers on conducting layers of a semiconductor device. Such methods are particularly compatible with single and double damascene fabrication processes. The method begins by providing a substrate having formed thereon electrically conducting layer comprised of a copper-containing material (901). Such electrically conducting layers can be inlaid conducting layers formed in openings or recesses in insulating layers of semiconductor wafer surfaces. These conducting layers are then capped using an alloy capping layer. The details of such capping layer formation have been described herein above and will only be briefly described here.

A layer of reactive material is formed on the surface of the substrate (903). Suitable materials include, but are not limited to calcium, strontium, barium, or other alkaline earth metals. Also, cadmium and selenium can be used. The methods for accomplishing effective deposition have been already discussed. The layer of reactive material reacts with the copper-containing material of the conducting layer to form an alloy material that is resistant to copper diffusion (905). It is believed that copper from the conducting layer diffuses into the layer of reactive material where complexes (alloys) form. The formation of these alloy materials can be enhanced by raising the substrate temperature. The alloy material is resistant to copper diffusion and therefore serves as an effective barrier or capping layer. The alloy material forms on the conducting layer thereby becoming self-aligned with the conducting layer. Once the alloy material has formed, the unreacted (unalloyed) reactive material from the reactive layer is removed from the substrate leaving alloy material in place on the conducting layer to form a capping layer (907). As discussed herein, the unreacted material can be removed by heating the substrate to a temperature where the unreacted material is preferentially desorbed while the alloy remains in place. In some embodiments, the process ends here. In other embodiments, the operations of deposition, alloy creation, and removal of unreacted material can be repeated over and over again until the alloy layer is formed to a desired thickness.

FIG. 10 is a flow diagram that depicts another method embodiment that can be employed to construct alloy capping layers on conducting layers of a semiconductor device. Such methods are particularly compatible with single and double damascene fabrication processes. The method begins by providing a substrate having formed thereon electrically conducting layer comprised of a copper-containing material (1001). Such electrically conducting layers can be inlaid conducting layers formed in openings or recesses in insulating layers of semiconductor wafer surfaces. These conducting layers are then capped using an alloy capping layer. The details of such capping layer formation have been described herein above and will only be briefly described here.

A layer of reactive material is formed on the surface of the substrate (1003). Suitable materials include, but are not limited to calcium, strontium, barium, or other alkaline earth metals, as well as materials from other groups, for example, selenium, or cadmium. The methods for accomplishing effective deposition have been already discussed. The layer of reactive material reacts with the copper-containing material of the conducting layer to form an alloy material that is resistant to copper diffusion (1005). The alloy material forms on the conducting layer. Such alloy formation can be enhanced by raising the substrate temperature. The reactive layer is then pattern masked with photoresist (1007). The pattern is such that a later etching step removes the reactive layer from the substrate surface except in the regions above the conducting layer. After, pattern masking the surface is etched to remove the reactive layer from the substrate surface except in the regions above the conducting layer (1009). The pattern mask is then removed (1011).

This leaves in place the alloy which is coated with a thin layer comprising the remains of the reactive layer. The remains of the reactive layer can be removed by heating the substrate to a temperature where the unreacted material is preferentially desorbed while the alloy remains in place (1013). The resulting alloy layer comprises the alloy capping layer.

After formation of these alloy capping layers, the surface can also be subjected to further processing, for example, additional process layers can be constructed over the surface.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that these capping layers can be used with conducting layers that are not inlaid in insulating layers. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for forming a capping layer on a copper-containing conducting structure, the method comprising:

provinding a substrate having formed thereon electrically conducting layer comprised of a copper-containing material; and forming an alloy capping layer on the electrically conducting layer such that the alloy capping layer is resistant to copper diffusion wherein the operation of forming an alloy capping layer includes forming an alloy capping layer that includes copper alloyed with a material selected from the group consisting of cadmium, selenium, and an alkali earth metal.

2. The method of claim 1, wherein the operation of forming an alloy capping layer includes forming an alloy capping layer that includes copper alloyed with an alkaline earth metal.

3. A method for forming a capping layer on a copper-containing conducting structure, the method comprising:

providing a substrate having formed thereon electrically conducting layer comprised of a copper-containing material; and forming an self-aligned alloy capping layer on the electrically conducting layer such that the alloy capping layer is resistant to copper diffusion wherein said forming process includes the operations of:

forming a layer of reactive material on the surface of the substrate, the reactive material being selected from the group of materials consisting of cadmium, selenium, and alkali earth metals;

reacting a portion of the layer of reactive material with the copper-containing material of the conducting layer to form an alloy material that is resistant to copper diffusion, the alloy material being formed on the conducting layer; and removing unalloyed reactive material from the substrate leaving alloy material in place on the conducting layer to form a capping layer.

4. The method of claim 3, wherein the reactive material is an alkaline earth metal.

5. The method of claim 4, wherein the reactive material is calcium.

6. The method of claim 5, wherein the alloy material comprises a complex of calcium and copper.

7. The method of claim 3, wherein the operation of removing unalloyed reactive material from the substrate leaving alloy material in place on the conducting layer to form a capping layer comprises heating the substrate to a temperature where the unalloyed reactive material desorbs from the surface of the substrate but where the alloy material remains in place on the substrate surface thereby forming a self-aligned capping layer.

8. A method for forming a capping layer on a copper-containing conducting structure, the method comprising:

providing a substrate having an electrically conducting layer comprised of a copper-containing material formed thereon; and forming an alloy capping layer on the electrically conducting layer such that the alloy capping layer is resistant to copper diffusion and includes a self-aligned capping layer over the conducting layer, wherein the operation of forming a self-aligned capping layer over the conducting layer comprises:

forming a layer of reactive material on the surface of the substrate;

reacting a portion of the layer of reactive material with the copper-containing material of the conducting layer to form an alloy material that is resistant to copper diffusion, the alloy material being formed on the conducting layer;

heating the substrate to a temperature where the unalloyed reactive material desorbs from the surface of the substrate but where the alloy material remains in place on the substrate surface; and repeating operations of forming a layer of reactive material, reacting the layer of reactive material with a copper-containing material to form an alloy material, and heating the substrate to a temperature to desorb unalloyed reactive material, until a layer of alloy material having a desired thickness remains in place on the substrate surface, thereby forming a self-aligned capping layer.

9. The method of claim 8, wherein the operation of reacting a portion of the layer of reactive material with the copper-containing material of the conducting layer to form an alloy material comprises heating the substrate such that the rate of alloy material formation is increased.

10. The method of claim 8, wherein the reactive material is selected from the group consisting of calcium, cadmium, strontium, barium, and selenium.

11. The method of claim 8, wherein the reactive material is an alkaline earth metal.

12. The method of claim 8, wherein the reactive material is calcium.

13. A method for forming a capping layer on a copper-containing conducting structure, the method comprising:

providing a substrate having formed thereon electrically conducting layer comprised of a copper-containing material; and forming an alloy capping layer on the electrically conducting layer such that the alloy capping layer is resistant to copper diffusion and wherein the operation of forming an alloy capping layer over the conducting layer comprises:

forming a layer of reactive material on the surface of the substrate, wherein the reactive material is selected from the group consisting of cadmium, selenium and alkali earth metals;

reacting a portion of the layer of reactive material with the copper-containing material of the conducting layer to form an alloy material that is resistant to copper diffusion, the alloy material being formed on the conducting layer;

pattern masking the layer of reactive material such that mask material covers the regions of reactive material over the conducting layer;

etching away the layer of reactive material not covered by the mask;

removing the mask material; and removing remaining reactive material from the substrate leaving alloy material in place on the conducting layer to form a capping layer.

14. The method of claim 13, wherein the reactive material is selected from the group consisting of calcium, cadmium, strontium, barium, and selenium.

15. The method of claim 13, wherein the reactive material is an alkaline earth metal.

16. The method of claim 13, wherein the reactive material is calcium.

17. The method of claim 16, wherein the alloy material comprises a complex of calcium and copper.

18. The method of claim 13, wherein the operation of removing remaining reactive material from the substrate leaving alloy material in place on the conducting layer to form a capping layer comprises heating the substrate to a temperature where the remaining reactive material desorbs from the surface of the substrate but where the alloy material remains in place on the substrate surface thereby forming the capping layer.

19. A method for forming a capping layer on a copper-containing conducting structure, the method comprising:

providing a substrate having formed thereon an electrically conducting layer comprised of a copper-containing material; and forming an alloy capping layer on the electrically conducting layer, the alloy includes copper alloyed with a material selected from the group consisting of cadmium, selenium, and alkaline earth metals, the alloy configured to prevent diffusion of copper from the electrically conducting layer through the capping layer.

20. The method of claim 19, wherein the operation of forming an alloy capping layer includes forming an alloy capping layer that includes copper alloyed with a material selected from the group consisting of calcium, cadmium, strontium, barium, and selenium.

21. The method of claim 19, wherein the operation of forming an alloy capping layer includes forming an alloy capping layer that includes copper alloyed with an alkaline earth metal.

22. The method of claim 19, wherein the operation of forming an alloy capping layer over the conducting layer comprises:

forming a layer of reactive material on the surface of the substrate such that a portion of the reactive material overlies the conducting layer;

reacting the portion of the reactive material that overlies the conducting layer with the copper-containing material of the underlying conducting layer to form an alloy material that is resistant to copper diffusion, the alloy material being formed on the conducting layer; and removing unalloyed reactive material from the substrate leaving alloy material in place on the conducting layer to form a capping layer.

23. The method of claim 22, wherein the operation of reacting a portion of the layer of reactive material with the copper-containing material of the conducting layer to form an alloy material comprises heating the substrate to enhance the formation of alloy material.

* * * * *